(12) United States Patent
Goujard et al.

(10) Patent No.: US 7,182,980 B2
(45) Date of Patent: Feb. 27, 2007

(54) CHEMICAL VAPOR INFILTRATION METHOD FOR DENSIFYING POROUS SUBSTRATES HAVING A CENTRAL PASSAGE

(75) Inventors: Stéphane Goujard, Merignac (FR); Bruno Bernard, Pessac (FR); Jean-Philippe Richard, Le Taillan Medoc (FR)

(73) Assignee: Snecma Propulsion Solide, Le Haillan (FR)

( * ) Notice: Subject to any disclaimer, the term of this patent is extended or adjusted under 35 U.S.C. 154(b) by 330 days.

(21) Appl. No.: 10/468,031

(22) PCT Filed: Mar. 6, 2002

(86) PCT No.: PCT/FR02/00803

§ 371 (c)(1),
(2), (4) Date: Aug. 14, 2003

(87) PCT Pub. No.: WO02/070775

PCT Pub. Date: Sep. 12, 2002

(65) Prior Publication Data

US 2004/0071877 A1    Apr. 15, 2004

(30) Foreign Application Priority Data

Mar. 6, 2001    (FR) .................................. 01 03004

(51) Int. Cl.
*C23C 16/00* (2006.01)
(52) U.S. Cl. ................. 427/249.3; 427/249.2; 427/249.1; 427/248.1
(58) Field of Classification Search ............. 427/249.2, 427/249.3, 249.1, 248.1
See application file for complete search history.

(56) References Cited

U.S. PATENT DOCUMENTS

| 4,154,322 | A | | 5/1979 | Yamamoto et al. ........ 188/73.5 |
| 5,348,774 | A | | 9/1994 | Golecki et al. |
| 5,904,957 | A | * | 5/1999 | Christin et al. .......... 427/248.1 |
| 6,083,560 | A | * | 7/2000 | Fisher et al. ............ 427/249.2 |
| 6,109,209 | A | | 8/2000 | Rudolph et al. |
| 6,284,969 | B1 | | 9/2001 | Fraas et al. ................ 136/253 |

FOREIGN PATENT DOCUMENTS

| EP | 0 832 863 A2 | 4/1998 |
| EP | 0 792 384 B1 | 10/1998 |

(Continued)

*Primary Examiner*—Timothy Meeks
*Assistant Examiner*—Howard Abramowitz
(74) *Attorney, Agent, or Firm*—Weingarten, Schurgin, Gagnebin & Lebovici LLP

(57) ABSTRACT

Annular substrates (20) are stacked in an enclosure where they define an inside volume (24) and an outer volume (26) outside the stack. A gas containing at least one precursor of a matrix material to be deposited within the pores of the substrates is channeled inside the enclosure to a first one (24) of the two volumes, and a residual gas is extracted from the enclosure from the other one (26) of the volumes. One or more leakage passages (22) allow the volumes to communicate with each other, other than through the substrates. The total section of the leakage passages has a value lying between a minimum value for ensuring that a maximum gas pressure in the first volume is not exceeded until the end of densification, and a maximum value such that a pressure difference is indeed established between the two volumes from the beginning of densification.

24 Claims, 11 Drawing Sheets

FOREIGN PATENT DOCUMENTS

| | | |
|---|---|---|
| EP | 1 158 568 A2 | 11/2001 |
| FR | 2 754 813 A | 4/1998 |
| GB | 419 949 | 11/1934 |
| GB | 1 311 537 | 3/1973 |
| WO | WO 95/11869 | 5/1995 |

* cited by examiner

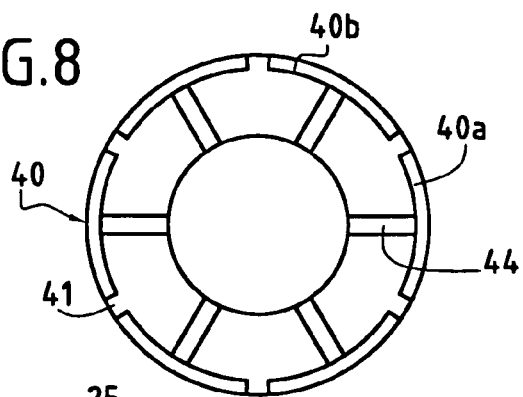
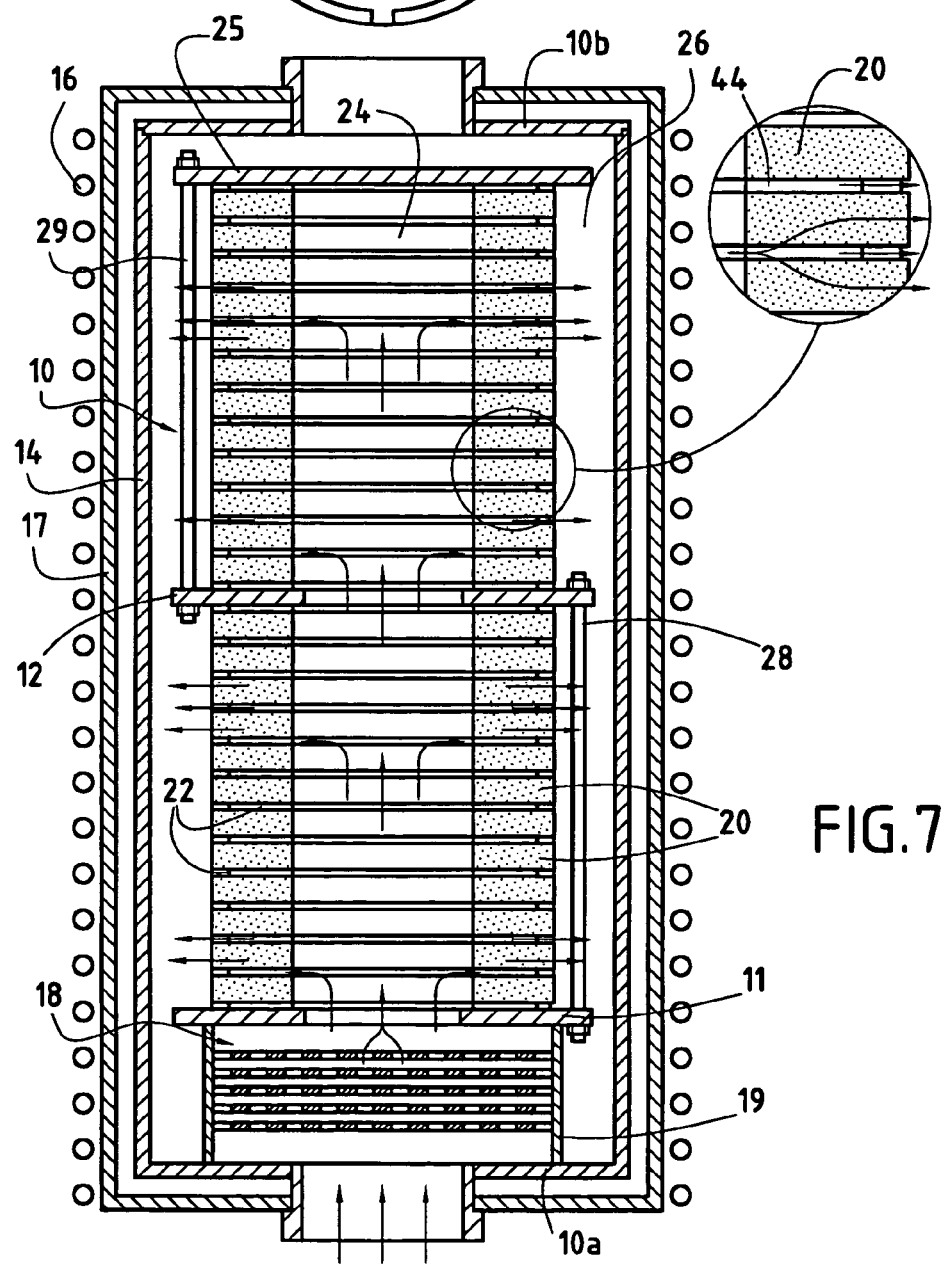

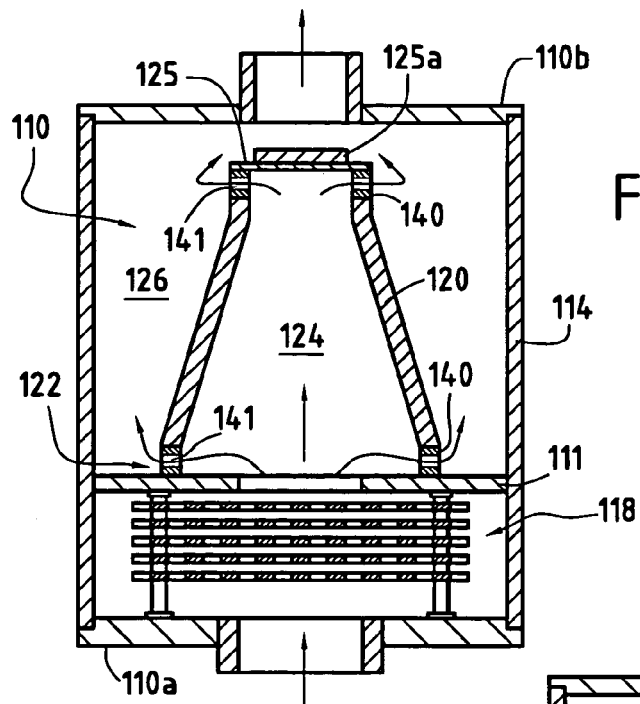
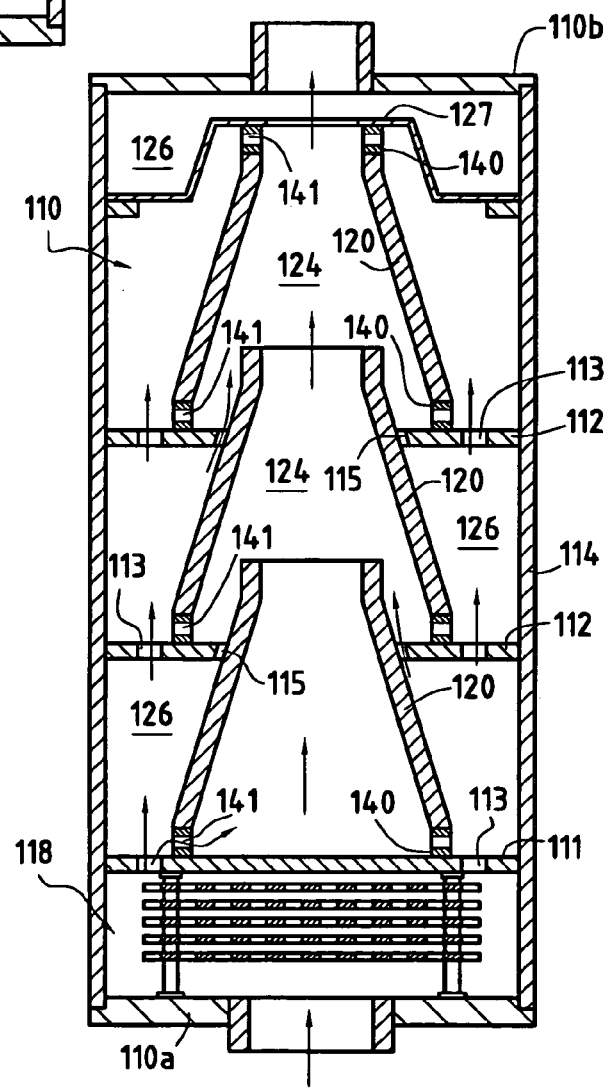
FIG.20
FIG.21

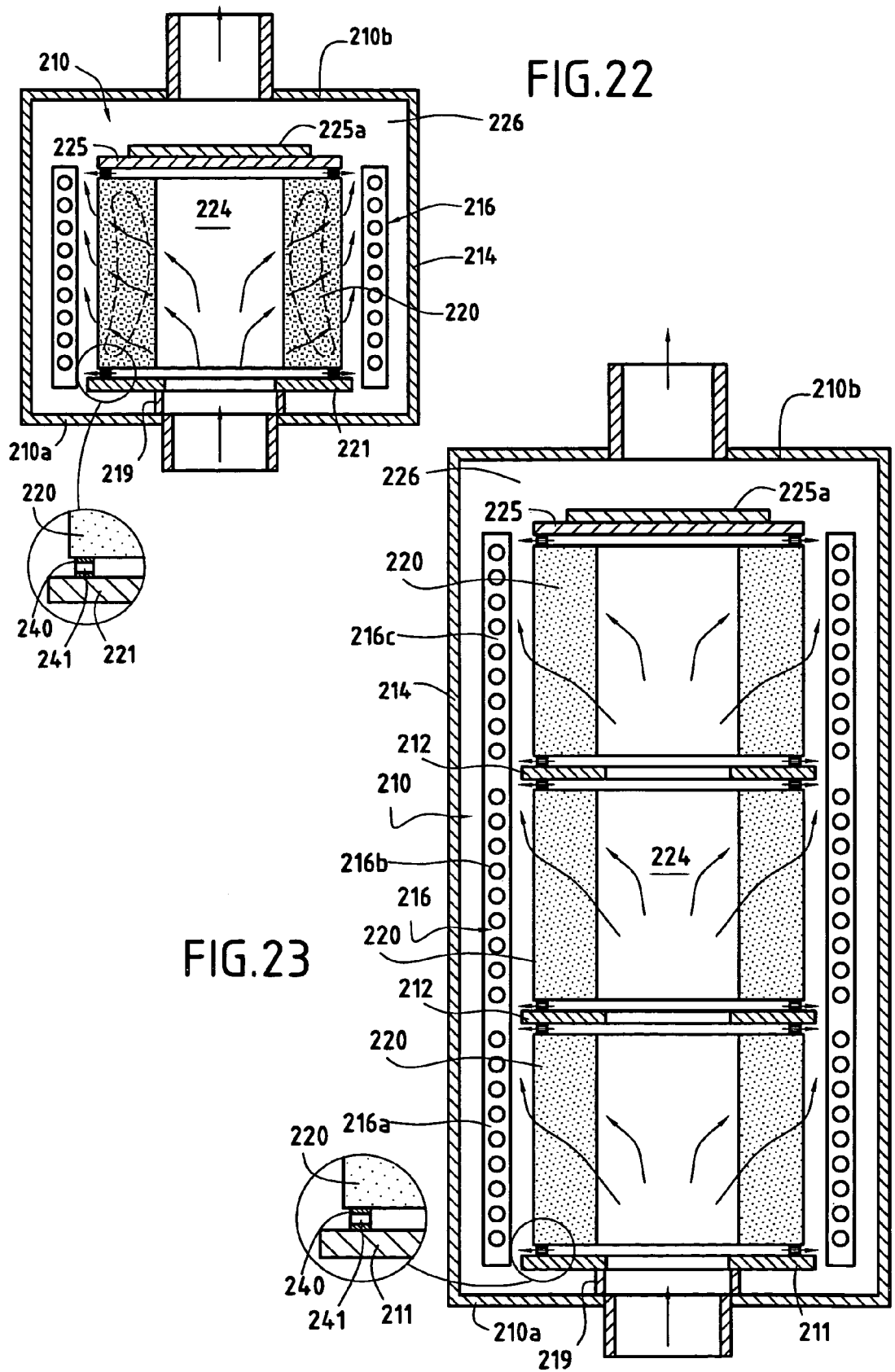

CHEMICAL VAPOR INFILTRATION METHOD FOR DENSIFYING POROUS SUBSTRATES HAVING A CENTRAL PASSAGE

BACKGROUND OF THE INVENTION

The invention relates to making parts out of composite material comprising a porous substrate densified by a matrix, and it relates more particularly to making parts that have a central passage.

The invention is particularly, but not exclusively, applicable to making annular brake disks or diverging portions or throats for rocket engine nozzles out of thermostructural composite materials.

Thermostructural composite materials are remarkable for their high mechanical properties and their ability to retain these properties at high temperature. Typical examples of thermostructural composite materials are carbon-carbon (C—C) composites comprising a porous reinforcing substrate of carbon fibers densified by a matrix of carbon, and ceramic matrix composites (CMCs) comprising a porous reinforcing substrate of refractory fibers (e.g. carbon fibers or ceramic fibers) densified by a ceramic matrix (e.g. silicon carbide).

Methods of densification by means of chemical vapor infiltration (CVI) are well known. One or more porous substrates are placed inside an enclosure. A gas containing one or more precursors of the matrix-constituting material is introduced into the enclosure. Temperature and pressure conditions are adjusted so as to enable the gas to diffuse within the pores of the substrates so as to deposit the matrix-constituting material by means of one of the components of the gas decomposing or by means of a reaction between a plurality of components. Various gaseous precursors enabling carbon or ceramic matrices to be obtained are well known.

Various known methods are briefly outlined below in the context of making annular disk brakes out of C—C composite material, it being understood that these methods are applicable to making other annular parts (i.e. parts having a central passage), whether out of C—C composite material or out of some other composite material.

FIG. 1 is a highly diagrammatic view of an enclosure 10 containing a load of annular preforms or substrates 20 of carbon fibers. The load is in the form of a stack of substrates having their central passages in vertical alignment. The stack may be made up of a plurality of superposed sections separated by one or more intermediate support plates 12.

The stacked substrates are separated from one another by means of spacers 30. As shown in FIG. 2, the spacers 30 may be disposed radially, and the number of them may vary. They provide gaps 22 of substantially constant height throughout the entire stack between adjacent substrates, while allowing the inside volume 24 of the stack, as constituted by the aligned central passages of the substrates, to communicate with the outer volume 26 situated outside the stack and inside the enclosure 10.

In the example of FIG. 1, the enclosure contains a single stack of substrates. In a variant, a plurality of stacks of substrates may be disposed side by side in the same enclosure.

The enclosure 10 is heated by means of a susceptor 14, e.g. made of graphite, which serves to define the enclosure 10 and which is inductively coupled with an induction coil 16 situated outside a casing 17 surrounding the susceptor. Other methods of heating may be used, for example resistive heating (the Joule effect).

A gas containing one or more precursors of carbon, typically hydrocarbons such as methane and/or propane, is admitted into the enclosure 10. In the example shown, admission takes place through the bottom 10a of the enclosure. The gas passes through a preheater zone 18 formed by one or more pierced plates disposed one above another in the bottom portion of the enclosure, beneath the plate 11 supporting the stack of substrates. The gas heated by the preheater plates (which are raised to the temperature that exists inside the enclosure) flows freely into the enclosure, passing simultaneously into the inside volume 24, into the outer volume 26, and into the gaps 22.

The residual gas is extracted from the enclosure by suction through an outlet formed in the cover 10b.

A drawback of such a disposition is that a relatively small fraction of the gas flows in the gaps 22, which means that the substrates 20 are poorly fed with reactive gas since their large faces are adjacent to the gaps 22.

In order to avoid that drawback, U.S. Pat. No. 5,904,957 proposes modifying the disposition of FIGS. 1 and 2 in the manner shown diagrammatically in FIGS. 3 and 4.

The gas admitted into the enclosure and leaving the preheater zone 18 is channeled by a wall 19 into the inside volume 24 of the stack of substrates 20, and the inside volume 24 is shut off by a wall 25 at its end opposite from the end where the gas is admitted. The outlet for residual gas from the chamber 10 communicates with the outer volume 26.

As a result, the flow of gas is directed so as to flow from the inside volume 24 towards the outer volume 26 by passing through the pores of the substrates 20 and also through the gaps 22, between the radial spacers 30.

With that "directed-flow" type method of chemical vapor infiltration, the substrates 20 are fed better with the reactive gas. The gaps 22 between the substrates leave passages for the gas such that the pressures in the inside volume 24 and in the outer volume 26 are equal.

A similar result could be obtained by causing the gas to flow in the opposite direction, i.e. from the outer volume 26 towards the inside volume 24, the outer volume 26 being closed at its end opposite from the end where the gas is admitted, and the inside volume 24 communicating with the outlet for removing residual gas from the enclosure.

Another disposition, as shown in FIGS. 5 and 6, is proposed in document EP 0 792 385.

That disposition differs from the disposition of FIGS. 3 and 4 in that the gaps 22 between the substrates are closed off by using annular spacers 32 disposed beside the inside diameter or, as shown, beside the outside diameter of the substrates 20.

The gas is thus forced to flow from the inside volume 24 to the outer volume 26 by passing through the pores of the substrates 20, and a pressure difference is established between said two volumes. The method of densification by chemical vapor infiltration implemented under such circumstances is said to be of the "pressure gradient" type.

Compared with the equal pressure method of infiltration as implemented in the disposition of FIGS. 1 and 2, the method with a pressure gradient and forced gas flow enables densification to be performed more quickly.

However, the process is difficult to implement. As specified in document EP-0 792 385, the substrate 20 must be loaded into the enclosure 10 with great care in order to avoid gas leaking from the bottom of the stack, at the outlet from the preheater zone, between adjacent substrates, and also from the top of the stack. The wall 25 may be surmounted by a weight 25*a* serving to press it down in leaktight manner on the top of the stack by opposing the higher pressure that exists inside the stack.

In addition, when the process is continued beyond a threshold of substrate densification, leading to the pressure in the center of the stack becoming too high, the microstructure of the matrix has been observed by the applicant to become modified, and indeed large quantities of soot can be formed. Those phenomena are undesirable since they lead to a change in the properties of the material which can be harmful while it is in use. Furthermore, they can require the densification process to be stopped before the desired density level has been reached. It is then necessary subsequently to finish off densification, for example in a final chemical vapor infiltration step performed under equal pressures, as stated in document EP-0 792 384. In addition, the increase of pressure inside the stack as densification progresses causes the stack to swell, and that can have destructive effects.

OBJECT AND SUMMARY OF THE INVENTION

An object of the invention is to provide a method of using chemical vapor infiltration to densify porous substrates presenting a central passage, the method making it possible both to feed the substrates properly with reactive gas and to obtain a high degree of densification, more quickly than in the configurations described in above-mentioned U.S. Pat. No. 5,904,957, and without risk of the microstructure of the matrix material densifying the substrates becoming modified and without forming undesirable deposits.

This object is achieved by a method comprising the following steps:

placing one or more substrates inside an enclosure to define within the enclosure an inside volume formed essentially by the central passage of the substrate or the central passages of a plurality of substrates in alignment, and an outer volume formed essentially by the outside of the substrate(s);

voluntarily arranging at least one leakage passage putting said volumes into communication with each other other than through the substrates;

admitting into the enclosure a gas containing at least one gaseous precursor of a matrix material to be deposited within the pores of the substrate(s);

channeling the gas towards a first one of the inside and outer volumes, said first volume being closed at an end opposite from its end where the gas is admitted; and extracting the residual gas from the enclosure from the other or second one of the inside and outer volumes, in such a manner that the gas flows inside the enclosure from the first volume to the second volume by diffusing through the pores of the substrate(s) and by passing through the or each leakage passage;

which method further comprises, in accordance with the invention, the steps of:

defining a maximum acceptable threshold value inside the first volume for the pressure of the gas or for the partial pressure of the precursor contained in the gas; and conferring a value on the total section of the leakage passage(s) lying between a minimum value such that the maximum pressure value is not exceeded before the end of the densification process, and a maximum value such that a pressure difference is established between the first volume and the second volume as from the beginning of the densification process.

The method of the invention is remarkable in that it makes it possible to combine the advantages of the above-mentioned directed flow and forced flow chemical vapor infiltration methods, while avoiding their drawbacks.

The pressure difference between the inside and outer volumes is capped, which makes it possible to avoid exceeding the pressure threshold beyond which modifications are likely to occur in the microstructure of the material constituting the matrix, or unwanted deposits are likely to occur, or beyond which swelling of the stack might become troublesome. The infiltration method can then be continued without difficulty until a relatively high level of densification is reached, which level can possibly even correspond to the desired final density for the densified substrates, such that there is then no longer any need for an additional infiltration step.

It is necessary to be in pressure gradient infiltration mode from the beginning of the process. Consequently, the total section of the leakage passage(s) is given a value such that the pressure difference between the first and second volumes at the beginning of the densification process is preferably not less than 15% of the value of the pressure difference obtained in the absence of leakage passages.

It is also necessary to avoid exceeding the maximum pressure threshold at the end of the densification process. The total section of the leakage passage(s) is then given a value such that the pressure difference between the first and second volumes at the beginning of the densification process is preferably not greater than 85% of the value of the pressure difference obtained in the absence of leakage passages.

The method may be implemented by forming at least one stack of substrates with their central passages in alignment inside the enclosure, and by leaving spaces between adjacent substrates by means of spacers, said inside and outer volumes being constituted respectively by the inside and the outside of the stack(s), and by arranging for at least one of the spacers to form one or more leakage passages.

It is possible to use at least one annular spacer provided with at least one radial passage forming a leakage passage.

In a variant, it is possible to use at least one spacer made up of a plurality of portions, for example curved sectors, leaving leakage passages between one another.

When the leakage passages are made through a plurality of spacers, it is possible to confer values to the sections of the leakages passages between adjacent substrates that vary over the height of the or each stack. In which case, the leakage section between substrates preferably varies so as to grow between the end of the first volume where the gas is admitted and the opposite end.

Each spacer may be arranged so as to form one or more leakage passages. Nevertheless, in a stack that has a large number of substrates, maintaining the total leakage section within the desired limit requires a small section for each leakage passage. As densification progresses, the leakage passages then run the risk of becoming partially obstructed. In addition, arranging for leakage passages can lead to the spacers being weakened. This weakening can be combatted by increasing the thickness of the spacers, but that penalizes the capacity to load a large number of substrates to be densified.

Consequently, in order to avoid such drawbacks, it is preferable to form one or more leakage passages in a limited number of spacers, or even in only one spacer.

It is also possible to arrange one or more leakage passages other than through one or more spacers.

Thus, in another embodiment of the invention, at least one leakage passage is arranged on the path channeling the gas between the gas inlet into the enclosure and the inlet into said first volume. Under such circumstances, the leakage passage can be provided in a preheater zone for the gas.

In another implementation, at least one leakage passage is arranged through a wall closing said first volume at its end opposite from the end where the gas is admitted.

In the above other implementations, spacers can be used in which none of them provides a leakage passage between substrates.

The method of the invention may be implemented in an isothermal mode, i.e. with the substrates being heated in substantially uniform manner, or in a temperature gradient mode, i.e. with a fraction of the or each substrate being raised to a temperature that is higher than another fraction. The substrate(s) can be heated with a temperature gradient by direct coupling between the substrate and an induction coil.

BRIEF DESCRIPTION OF THE DRAWINGS

The invention can be better understood on reading the following description given by way of non-limiting indication and with reference to the accompanying drawings, in which:

FIG. 7 is a highly diagrammatic section view of a densification installation showing a particular implementation of a load of substrates in a stack for implementing a method of the invention, for the case of simultaneous densification of a plurality of annular substrates for disk brakes made of composite material;

FIG. 8 is a diagrammatic section view of the stack of substrates in FIG. 7;

FIG. 20 is a highly diagrammatic section view of an installation for densifying a substrate by implementing a method of the invention when the substrate to be densified is for the diverging portion of a rocket engine nozzle;

FIG. 21 is a highly diagrammatic section view of an installation for densifying a stack of substrates by implementing a method of the invention when simultaneously densifying a plurality of substrates for the diverging portions of rocket engine nozzles;

FIG. 22 is a highly diagrammatic section view of an installation for densifying a substrate by implementing a method of the invention, when the substrate to be densified is for the throat of a rocket engine nozzle; and FIG. 23 is a highly diagrammatic section view of an installation for densifying a stack of substrates by implementing a method of the invention when simultaneously densifying a plurality of substrates for the throats of rocket engine nozzles.

DETAILED DESCRIPTION OF EMBODIMENTS

Figure 2:
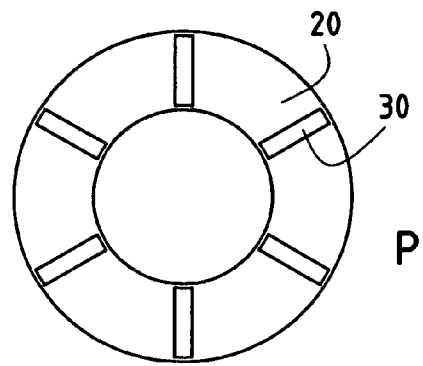
FIG. 2 is a diagrammatic section view of the stack of substrates in FIG. 1.
Figure 1:
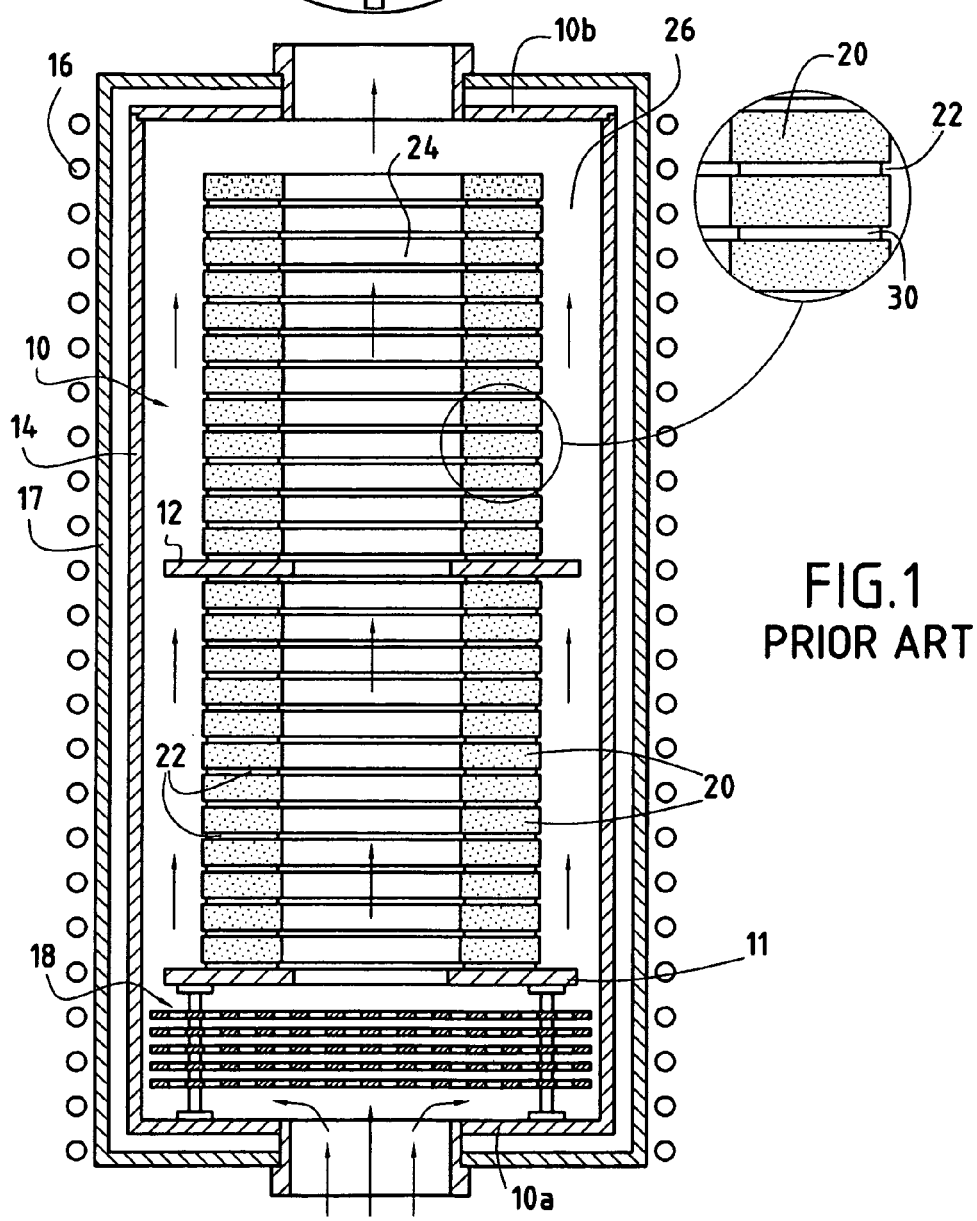
FIG. 1 is a highly diagrammatic section view of a load of substrates for implementing the prior art free-flow chemical vapor infiltration method.
Figure 4:
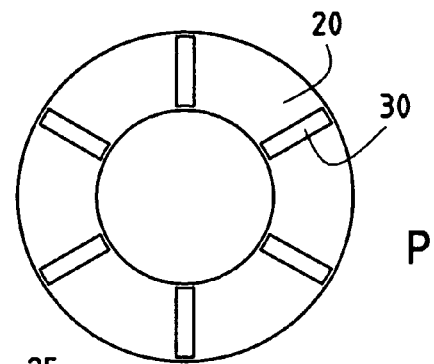
FIG. 4 is a diagrammatic section view of the stack of substrates in FIG. 3.
Figure 3:
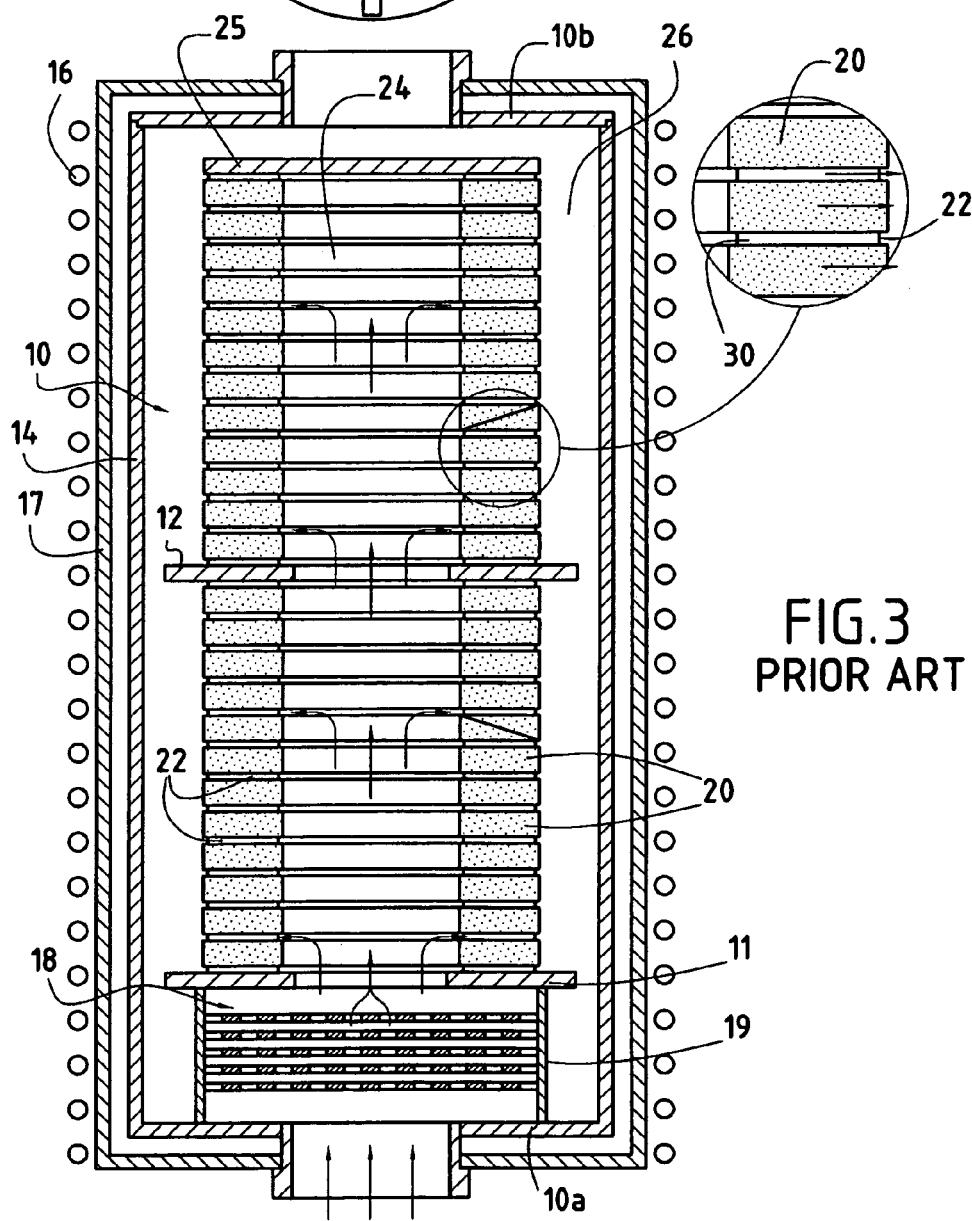
FIG. 3 is a highly diagrammatic section view of a load of substrates for implementing the prior art directed-flow chemical vapor infiltration method.
Figure 6:
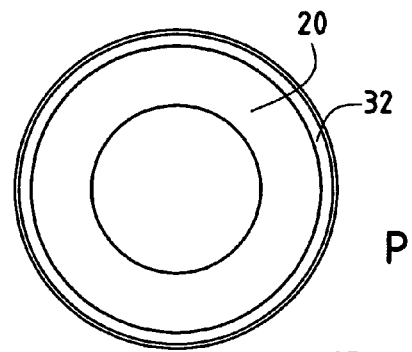
FIG. 6 is a diagrammatic section view of the stack of substrates in FIG. 5.
Figure 5:
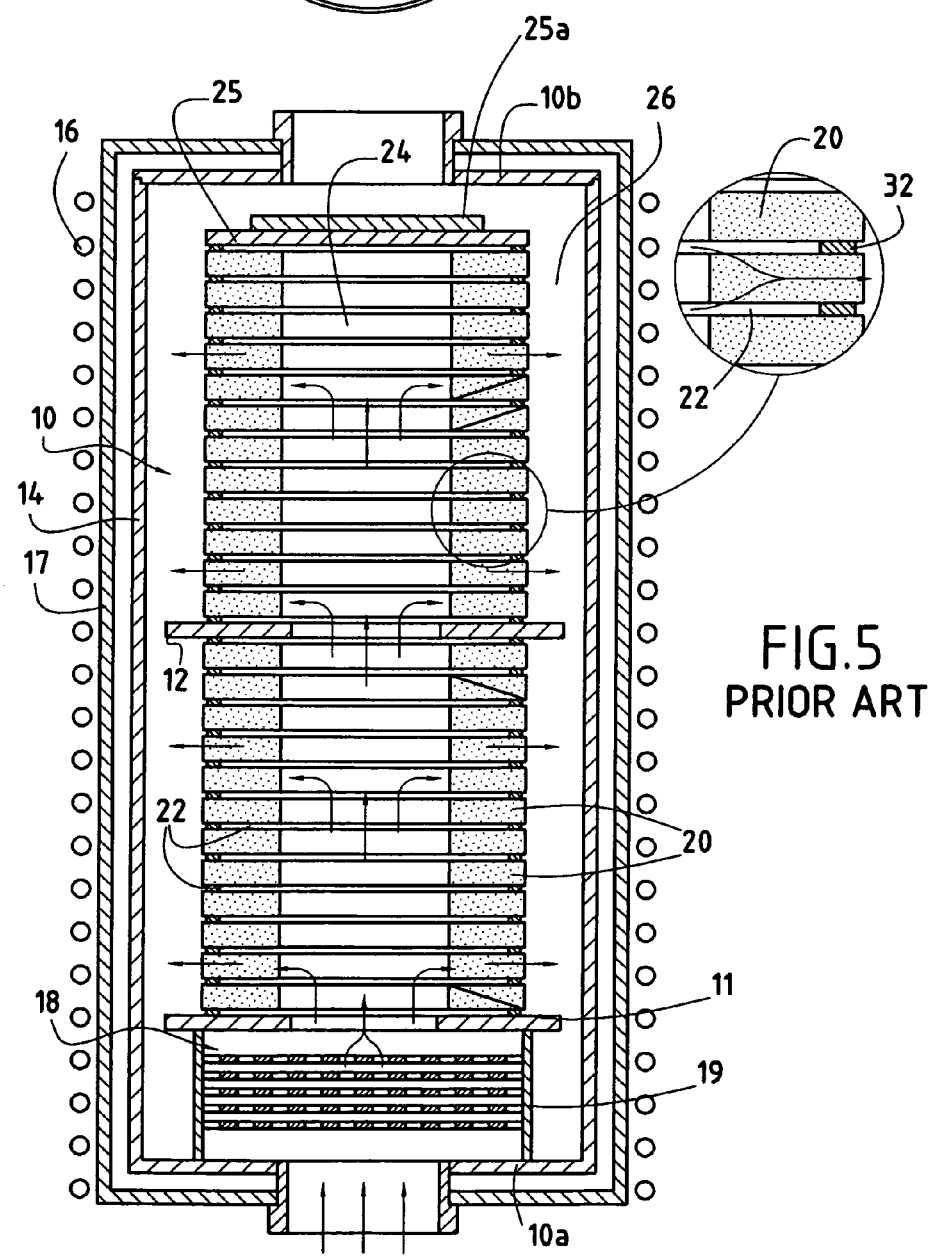
FIG. 5 is a highly diagrammatic section view of a load of substrates for implementing the prior art forced-flow chemical vapor infiltration method.

Reference is made directly to FIGS. 7 and 8, since FIGS. 1 to 6 are described above. Elements that are common to the embodiments of FIGS. 1 to 8 are given the same references therein.

FIG. 7 is a highly diagrammatic view of an enclosure 10 containing a load of annular substrates 20 such as annular preforms for brake disks made of thermostructural composite material. The substrates 20 are placed to form a vertical stack defining an inside volume 24 formed by the aligned central passages of substrates. The stack of substrates 20 rests on a bottom support plate 11 and can be made up of a plurality of superposed sections separated by one or more intermediate support plates 12.

Although only one stack of substrates is shown in FIG. 7, a plurality of stacks could be disposed side by side in the enclosure.

The enclosure is heated by means of a susceptor 14 which defines the side wall of the enclosure and which is inductively coupled with an induction coil 16 outside a casing 17 surrounding the susceptor, outside the enclosure. In a variant, the substrates could be heated by direct coupling between an induction coil and the substrates when the nature of the substrates makes this possible. A method of densifying porous substrates by chemical vapor infiltration with the substrates being heated by direct inductive coupling is described in document EP 0 946 461. Still in a variant, the heating of the wall 14 could be of the resistive type.

A gas containing one or more gaseous precursors of the material to be deposited within the pores of the substrates in order to density them is introduced into the enclosure 10 through the bottom 10a thereof. The gas passes through a preheater zone 18 situated in the bottom portion of the enclosure and formed, for example, by a plurality of superposed perforated plates. In the preheater zone, the gas is channeled by a wall 19 to flow towards the inside volume 24, which inside volume is closed at its top end by a wall 25 forming a cover resting on the stack of substrates.

Each substrate 20 is separated from an adjacent substrate, and where appropriate, a support plate 11 or 12 or the cover 25 by means of one or more spacers which define gaps 22. The spacers, or at least some of them, are arranged so as to form leakage passages putting the inside volume 24 of the stack into communication with the outer volume 26 situated outside the stack, inside the enclosure, while still allowing a pressure gradient to exist between the volumes 24 and 26.

As specified below, the total value S of the leakage passage sections defined by the spacers is given a desired predetermined value. It is then desirable to avoid having parasitic leaks that might falsify the total section value for leakage. For this purpose, the stack of substrates 20 is clamped by means of columns or posts 28 (only one is visible in FIG. 7) which connect the bottom support plate 11 to the intermediate support plate 12, with the ends thereof passing through the plates 11 and 12 and fixed by nuts, and columns or posts 29 (only one of which is visible in FIG. 7) connecting the plate 12 and the cover 25 in the same manner and serving to hold the cover against the higher pressure that exists inside the stack.

The gas admitted into the enclosure flows from the inside volume 24 to the outer volume 26 by diffusing through the porous substrates 20 and by passing through the leakage passages, outside the substrates 20.

The residual gas is extracted from the enclosure 10 through a passage formed in the top wall 10b of the enclosure, which passage is in communication with suction means such as a vacuum pump (not shown).

In a variant, the gas phase from the preheater zone can be channeled into the outer volume 26 which is then shut off at its top end. The gas then flows from the outside towards the inside of the stack, passing through the substrates 20 and the leakage passages formed in the gaps 22, and the residual gas is extracted from the inside volume 24 which then has an open top end.

In another variant, the gas can be admitted through the cover of the enclosure, with the preheater zone the being situated in the top portion of the enclosure. That one of the inside and outer volumes 24 and 26 into which the gas is channeled is then closed off at its bottom end, while the other volume is open at its bottom end to enable the residual gas to be extracted via a passage formed through the bottom of the enclosure.

It should also be observed that the method can be implemented using a single annular substrate. The gas flows from the inside towards the outside of the substrate, or vice versa, through the substrate and through one or more leakage passages external to the substrate. The leakage passage(s) can be formed in the spacers that leave gaps between the opposite faces of the substrate and the adjacent walls.

In the embodiment of FIG. 8, the spacers in the gaps 22 between adjacent substrates or between a substrate and an adjacent wall comprise an annular spacer 40 extending close to or at the outer perimeter of the substrates, together with radial spacers 44.

The annular spacers 40 close off the gaps 22 while leaving leakage passages through at least a fraction of said gaps. The radial spacers 44 contribute to ensuring that the preforms 20 are held in satisfactory manner and to imparting a height that is substantially constant to each gap 22. They can be omitted if the preforms are themselves sufficiently rigid.

The annular spacers 40 can be arranged to form leakage passages in various ways.

The spacers 40 may be made as a plurality of non-touching annular sectors 40a, 40b, . . . leaving leakage passages 41 between their ends (FIG. 8).

In a variant (FIG. 9) the annular spacers 40 may be made as single pieces, with the leakage passages 41 being constituted by radial holes formed through the spacers.

In another variant (FIG. 10), the annular spacers 40 may be made as single pieces, with the leakage passages 41 being constituted by notches formed in their top and/or bottom edges.

Figure 11:
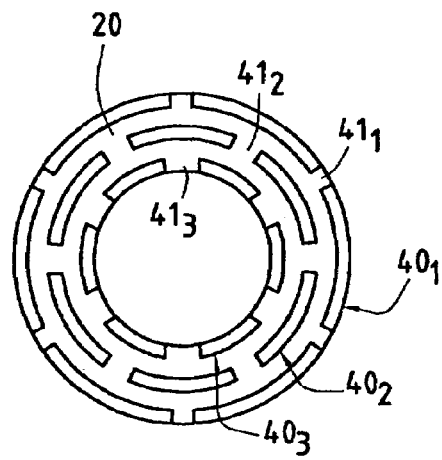
FIG. 11 is a detail view of another embodiment of spacers suitable for the load of substrates shown in FIGS. 7 and 8.

FIG. 11 shows another possible disposition for the spacers. In each gap 22, the spacers comprise a plurality of annular spacers $40_1$, $40_2$, $40_3$ that are discontinuous or that present notches or radial holes. Preferably, a one-piece annular spacer or an annular spacer made up of a succession of annular sectors is provided in the vicinity of both the inside and the outside perimeters of the substrates 20.

The leakage passages $41_1$ are defined by arranging the outer annular spacer $40_1$, i.e. either by spaces between the ends of adjacent annular sectors, or by radial holes, or by notches. The spacers $40_2$ and $40_3$ also leave passages $41_2$ and $41_3$, but these are preferably of dimensions that are greater than those of the passages $41_1$. Provision can be made for the leakage passages to be of dimensions that decrease starting from the inner perimeter of the substrates so as to feed sufficient gas to the gaps 22.

In order to define the section(s) of the leakage passage(s), it is possible to proceed as follows.

For a given load of porous substrates to be densified, the relationship is determined between the pressure difference $\Delta P$ between the inside and outer volumes 24 and 26 and the rate at which gas is admitted into the enclosure, with this being done for different values of total leakage section S, where the total leakage section is the sum of the individual sections of the leakage passages.

This determination is performed using substrates in the non-densified state, i.e. presenting maximum porosity so as to obtain a relationship between the initial value $\Delta P_0$ for the pressure difference and the total leakage section S.

Furthermore, depending on the particular type of chemical vapor infiltration that is to be performed, i.e. depending on the nature of the reaction gas, the nature of the matrix material that is to be deposited within the pores of the substrates, and on the temperature at which infiltration is to be performed, a maximum acceptable pressure threshold value $P_{max}$ is determined for the gas or for the partial pressure of the gaseous precursor(s) contained in the gas. The maximum acceptable pressure threshold $P_{max}$ is, in particular, the pressure above which undesired structural modification is likely to occur in the deposited matrix material, or above which undesirable parasitic deposits are likely to be formed.

The total value S of the leakage section is then selected so that $S_{min} \leq S \leq S_{max}$, where:

$S_{max}$ is the maximum value for the leakage section above which the pressure gradient is insufficient at the beginning of densification; and $S_{min}$ is the minimum value of the leakage section below which the pressure gradient that exists at the end of the densification process is such that the maximum acceptable pressure threshold $P_{max}$ is exceeded.

$S_{max}$ is determined from pre-established relationships between $\Delta P_0$ and S for various gas flow rates and various values of S. A value is preferably selected for $S_{max}$ that corresponds to a pressure gradient $\Delta P_0$ that is not less than 15% of the maximum value $\Delta P_{0max}$ that exists in the absence of leakage passages (S=0).

A value is selected for $S_{min}$ that preferably corresponds to a pressure gradient $\Delta P_0$ that is not greater than 85% of the maximum value $\Delta P_{0max}$ that exists in the absence of leakage passages (S=0).

The value of $\Delta P_0$ compared with the value $\Delta P_{0max}$ depends in particular on the shape and the initial permeability of the substrates to be densified. Relatively high initial permeability requires a value for $\Delta P_0$ that is closer to $\Delta P_{0max}$ in order to guarantee a pressure gradient from the beginning of the densification process.

EXAMPLE

An example of determining the total leakage section S is given below for a load of annular substrates constituting preforms for carbon brake disks.

The initial load was made up of 23 substrates stacked without any densification. Each substrate was constituted by a plurality of needled-together sheets of carbon fibers. Making preforms of this type for brake disks for use in aviation or in motor racing is well known. The substrates present an inside diameter of 26 centimeters (cm), an outside diameter of 48 cm, a height (thickness) of 3.6 cm, and a fiber volume fraction of 23% (percentage of the volume of the disks that is occupied by the fibers).

Initially, the pressure gradient between the inside and the outside of the stack was measured for different admitted gas flow rates, using annular spacers that were solid so as to leave no leakage passage (S=0), i.e. in a situation of forced-flow infiltration as described in above-mentioned document EP 0 792 385. Measurement was performed cold using an inert gas, specifically nitrogen. Curve A in FIG. 12 shows the measured relationship between the pressure difference $\Delta P_0$ and the flow rate of the admitted gas.

Thereafter, the same measurements were performed for different leakage sections. Curves B, C, D, and E show the relationships that were established for values of S equal respectively to 2.4 square centimeters ($cm^2$), 6 $cm^2$, 12.6 $cm^2$, and 30 $cm^2$.

Figure 12:
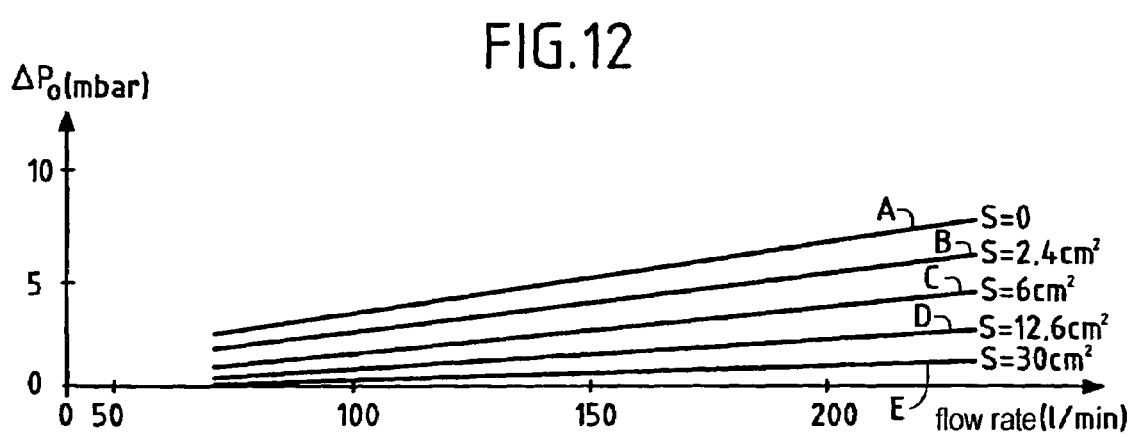
FIG. 12 is a graph plotting curves showing how pressure difference between the inside and the outside of a stack of substrates varies as a function of the flow rate of gas admitted into the inside volume of the stack, and as a function of leakage section.

The curves of FIG. 12 show that whatever the flow rate of the admitted gas, the value of S needs to be selected to be less than about 25 $cm^2$ so as to be able to have a value $\Delta P_0$ that is not less than 15% of the maximum value obtained without any leakage section (S=0), and must be greater than about 2 $cm^2$ in order to have a value $\Delta P_0$ that is not greater than 85% of the maximum value obtained when there is no leakage section (S=0).

Once the value has been selected for the total leakage section, its distribution as individual leakage passage sections can be determined in various ways.

The individual sections of the leakage passages may be equal or otherwise.

It is possible to provide leakage passages in each of the gaps 22 or in only some of said gaps, e.g. every other gap.

It is possible to provide individual leakage passages such that the total leakage section is distributed uniformly over the entire height of the stack.

Nevertheless, in order to take account of the head loss that occurs between the end of the stack where the gas is introduced and the opposite end, it is preferable to distribute the total leakage section in a manner that is not uniform, and more particularly in a manner that increases going from the bottom of the stack towards the top. This can be achieved by progressively increasing the number and/or the section of the individual leakage passages along the height of the stack.

It is also possible to provide only a small number of leakage passages, or even only a single leakage passage having the desired section.

Figure 14:
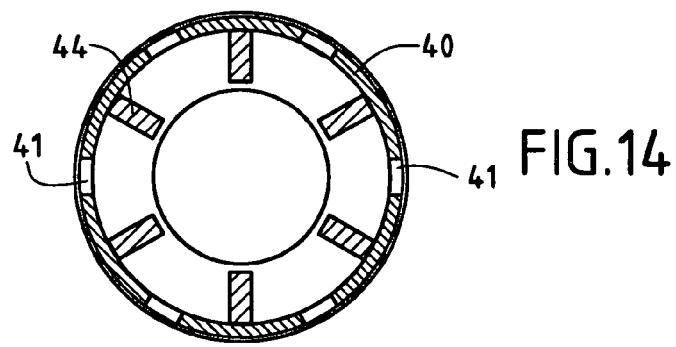
FIG. 14 is a diagrammatic section view in plane XIV—XIV of FIG. 13.
Figure 13:
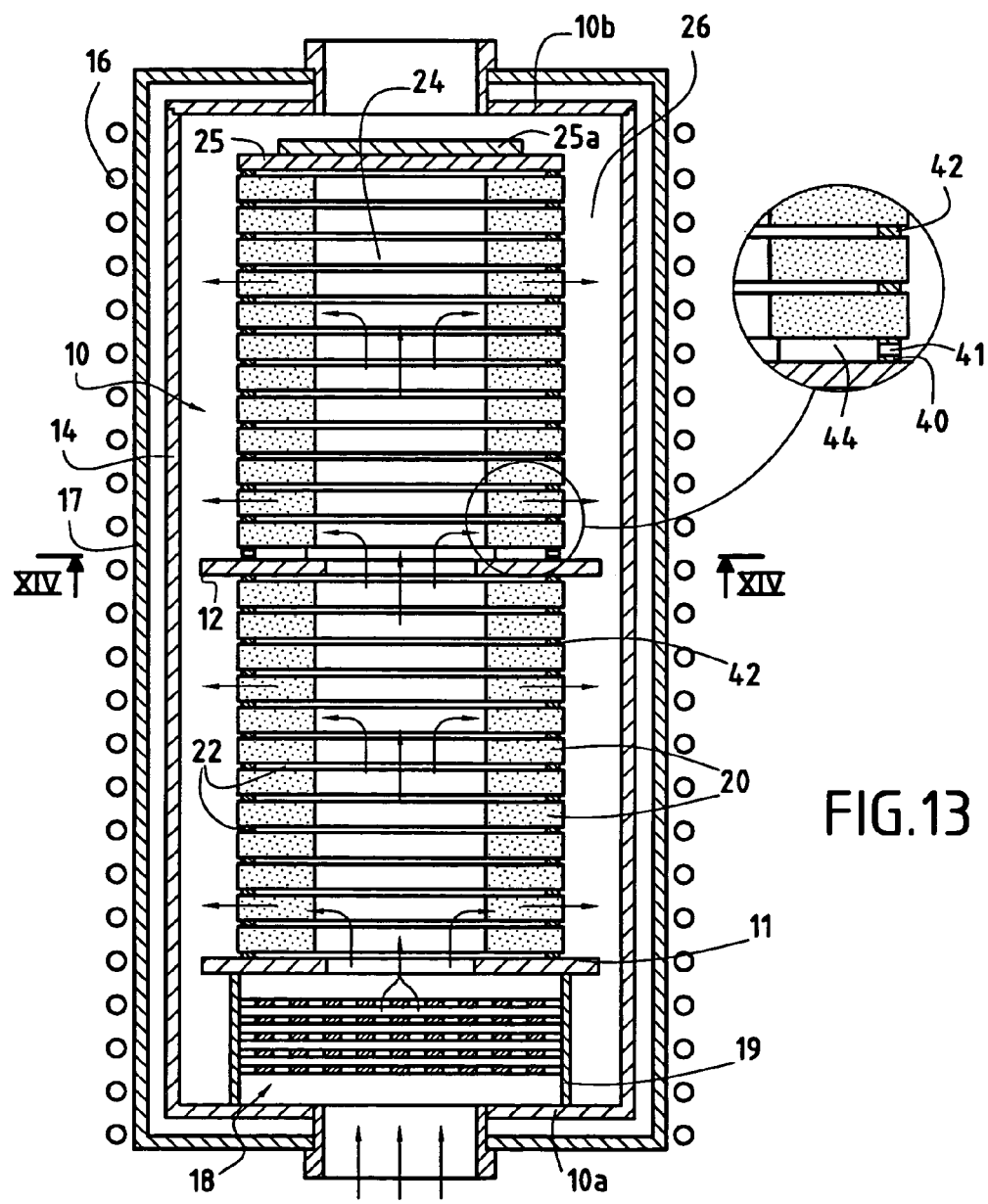
FIG. 13 is a highly diagrammatic section view showing a variant configuration for a load of substrates in a stack for implementing the method of the invention.

FIGS. 13 and 14 show a variant implementation of the method shown in FIGS. 7 and 8.

Figure 9:
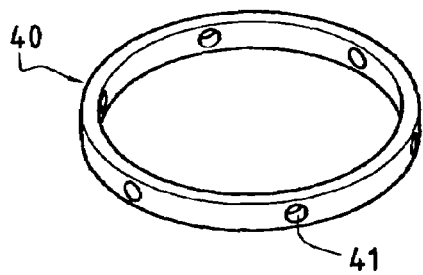
FIGS. 9 and 10 are detail views on a larger scale showing two embodiments of a spacer suitable for the load of substrates shown in FIGS. 7 and 8.

The load in FIGS. 13 and 14 differs from that of FIGS. 7 and 8 in that the leakage passages 41 are provided in a single spacer 40, for example a spacer of the type shown in FIG. 9, while the other spacers 42 are solid, i.e. do not provide any leakage passages.

The thickness of the spacer 40 may be greater than that of the spacers 42 in order to provide one, or preferably a plurality of leakage passages 41 that provide the desired total leakage section.

The spacer 40 may be placed anywhere in the stack, between two substrates or between a substrate and a support plate 11 or 12. It may be associated with radial spacer segments 44 (FIG. 14).

Nevertheless, it is not essential for the leakage passages to be formed in one or more spacers.

Figure 16:
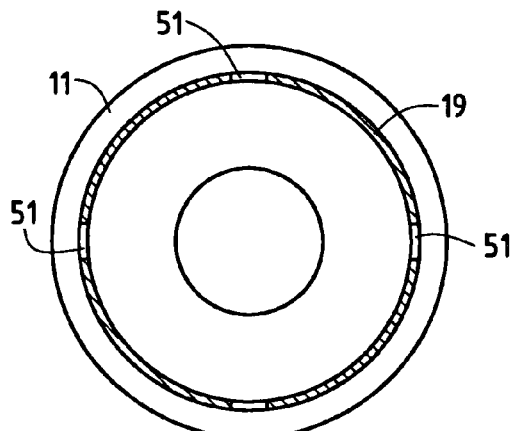
FIG. 16 is a diagrammatic and fragmentary section view on plane XVI—XVI of FIG. 15.
Figure 15:
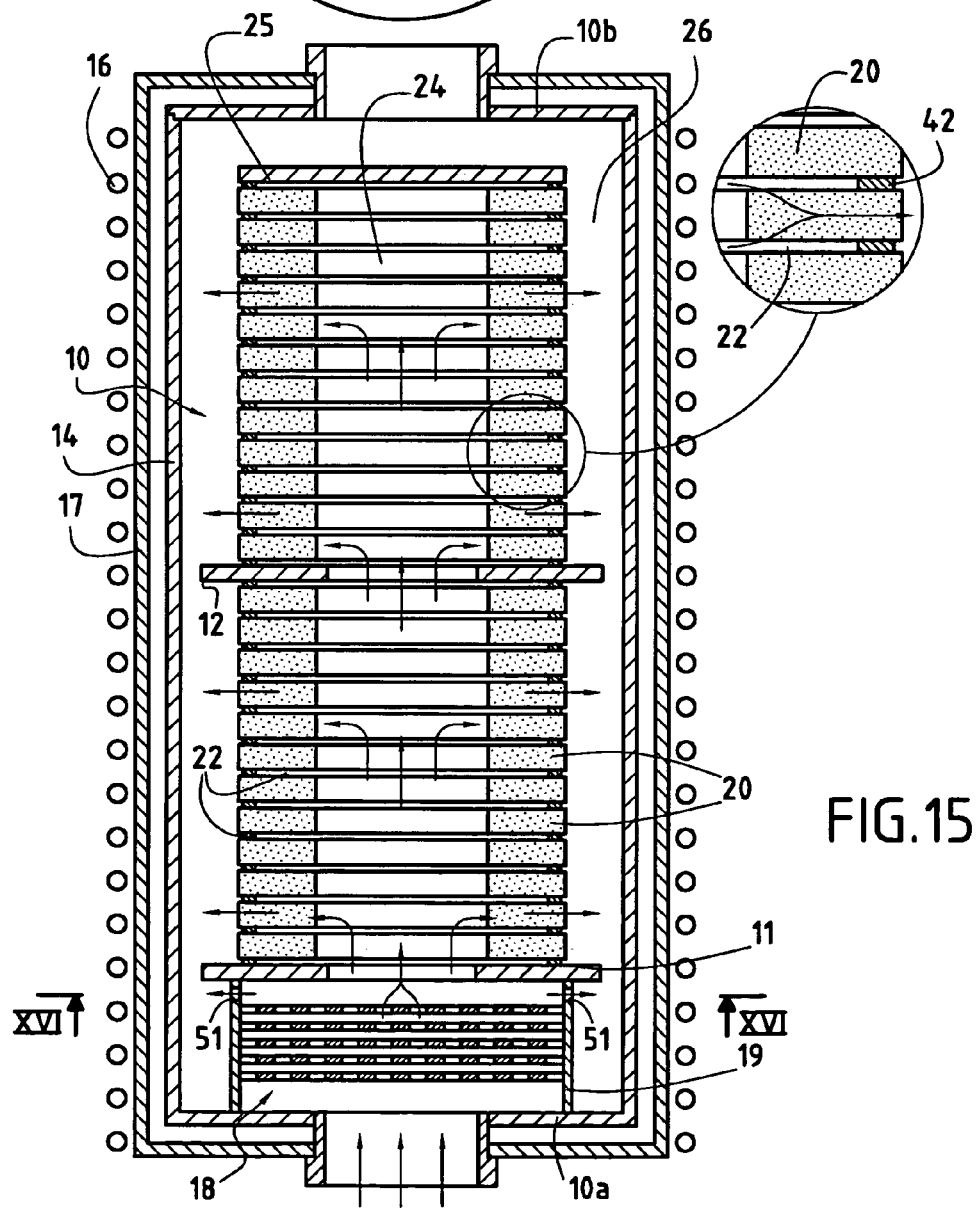
FIG. 15 is a highly diagrammatic section view of a densification installation for implementing another implementation of the method of the invention.

Thus, in the embodiment of FIGS. 15 and 16, one or more leakage passages 51 are formed in the wall 19 which channels the gas in the preheater zone between the inlet into the enclosure and the inlet into the inside volume of the stack of substrates. In the example shown, as shown by FIG. 16, a plurality of passages 51 are formed by being distributed around the wall 19. A single passage only could be provided.

Figure 17:
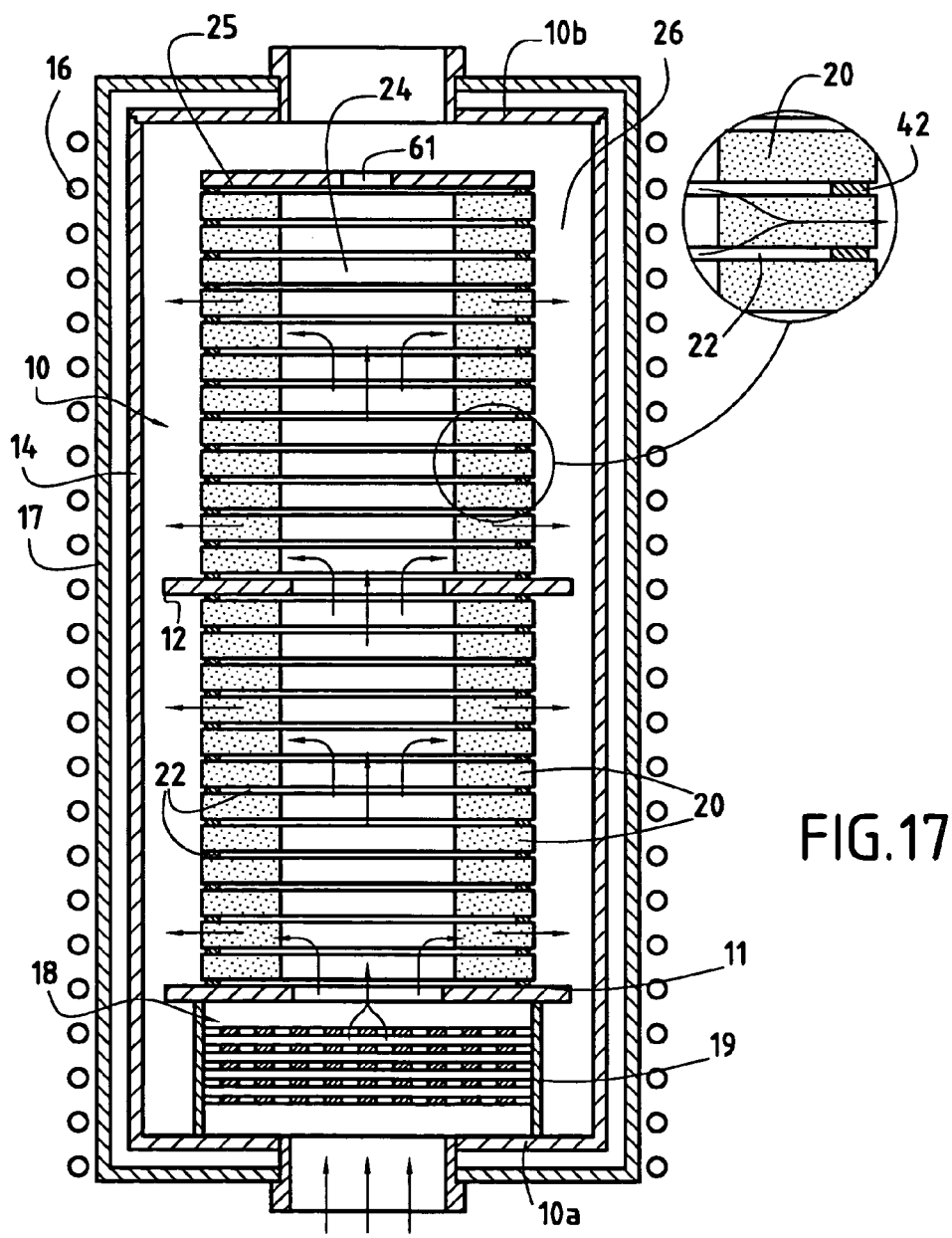
FIG. 17 is a diagrammatic section view of a densification installation for performing yet another implementation of the method of the invention.

FIG. 17 shows another implementation in which a leakage passage 61 is formed in the wall 25 closing off the inside volume of the stack of substrates at its top end. Although only one passage 61 is shown, it would naturally be possible to provide a plurality of passages through the wall 25.

In the embodiments of FIGS. 15 and 17, the spacers 42 are solid spacers that do not leave leakage passages, such that the leaks that are introduced voluntarily occur only through the wall 19 or through the wall 25.

Naturally, the various embodiments could be combined by providing leakage passages through the wall 19 and/or through one or more spacers and/or through the wall 25.

It should be observed that because of the above-mentioned problems associated with making leakage passages through each spacer, the embodiment of FIG. 7 is not preferred when a relatively large number of substrates are stacked.

Test 1 (Comparison)

The load of substrates as described above was densified by forced-flow chemical vapor infiltration, i.e. without leaving a leakage passage between the stack of substrates, with the method being implemented as described in document EP-0 792 385. A reactive gas was used that contained a mixture of methane and propane as carbon precursor. The flow rate of the gas was fixed at about 70 liters per minute (l/min) and the pressure $P_{ext}$ in the enclosure outside the stack of substrates was about 14 millibars (mbar).

Figure 18:
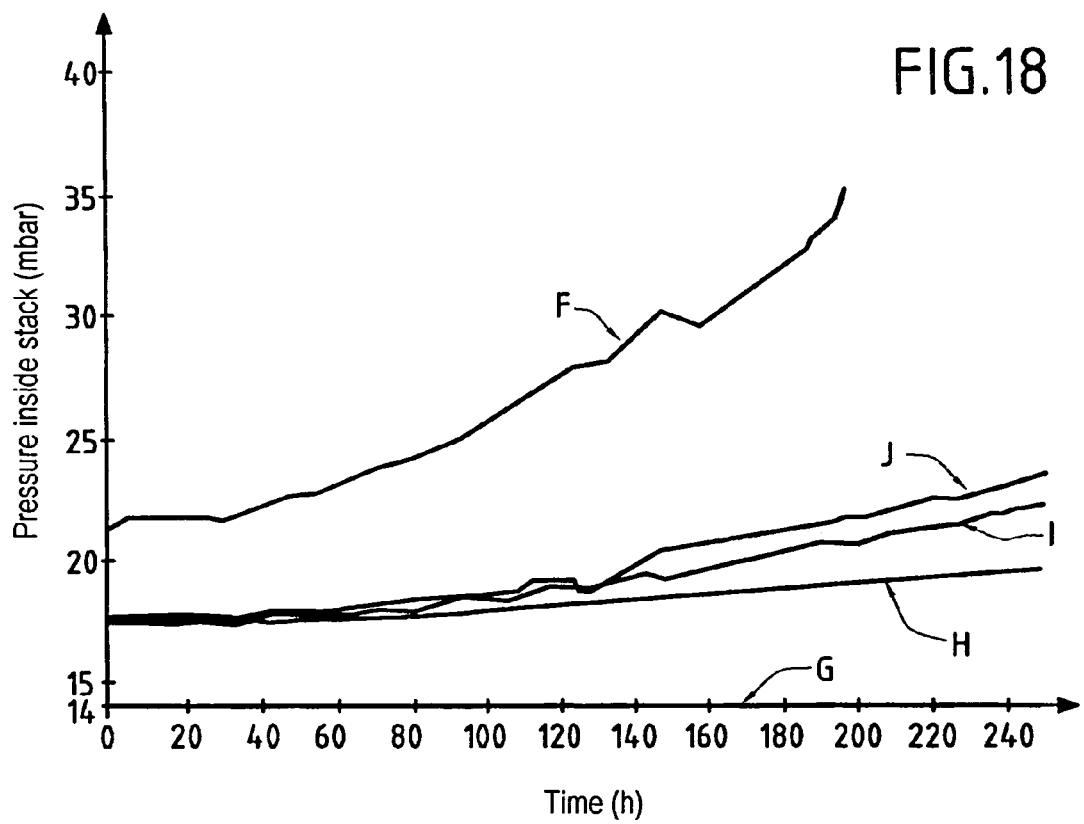
FIG. 18 is a graph plotting curves that show how the pressure of a reactive gas inside a stack of substrates varies as a function of time for prior art forced-gas flow and directed-gas flow densification methods, and for densification methods of the invention.

The value of the pressure $P_{int}$ inside the stack was measured during the process of densifying the substrates. Curve F in FIG. 18 shows how this pressure $P_{int}$ varied as a function of time.

After 200 hours (h), the process was interrupted since the inside pressure $P_{int}$ had reached the maximum acceptable pressure threshold $P_{max}$ beyond which a change occurs in the microstructure and soot is formed. The resulting disks were not completely densified, their mean relative density being 1.44, and that density was locally as little as 1.2.

$P_{int}$ and $P_{ext}$ were measured by means of sensors situated respectively in the inlet passage for admitting gas into the enclosure and in the outlet passage for removing residual gas from the enclosure, via the cover 10b.

Test 2 (Comparison)

A load of substrates as described above was densified by directed flux chemical vapor infiltration implementing the method described in document U.S. Pat. No. 5,904,957. The same reactive gas was used as in Test 1, with the same gas flow rate and the same pressure $P_{ext}$ inside the enclosure and outside the stack of substrates. The pressure $P_{int}$ in the stack remains constant and equal to $P_{ext}$ (curve G in FIG. 18). After 250 h, the mean relative density of the resulting disks was 1.19.

Test 3 (in Accordance with the Invention)

A load of substrates as described above was densified by chemical vapor infiltration using spacers of the kind shown in FIG. 9 providing leakage passages between stacked substrates, each spacer presenting six leakage passages. The total leakage section provided by the leakage passages was 11 cm² so that the pressure gradient $\Delta P_0$ corresponded to 50% of the maximum value $\Delta P_{max}$ that exists in the absence of any leakage (S=0). The same reactive gas was used as in Test 1, with the gas flow rate being the same and with the same pressure $P_{ext}$ inside the enclosure, outside the stack of substrates.

The value of the pressure $P_{int}$ inside the stack was measured throughout the process of densifying the substrates which was continued for 250 h. Curve H in FIG. 18 shows how this pressure $P_{int}$ varied as a function of time. During the 250 h of the process, the inside pressure $P_{int}$ increased more slowly than in Test 1. At 250 h, the mean relative density of the resulting disks was 1.47. The inside pressure $P_{int}$ was 19.7 mbar at the end of 250 h, so it would have been possible to continue densification in order to obtain higher density, without any immediate risk of change in microstructure or soot formation.

Test 4 (in Accordance with the Invention)

This test was the same as Test 3 except that the spacers used each had two holes forming leakage passages and the total leakage section provided was 3.6 cm².

Curve I in FIG. 18 shows how the inside pressure $P_{int}$ varied as a function of time. At 250 h, the mean relative density of the resulting disks was 1.47.

Test 5 (in Accordance with the Invention)

This test was the same as Test 3, but the spacers between the stacked substrates did not provide any leakage passages, and leakage passages were provided by holes in the wall 19 of the preheater zone as shown in FIGS. 15 and 16. The total leakage section provided was 2.35 cm² .

Curve J in FIG. 18 shows how the inside pressure $P_{int}$ varied as a function of time. At 250 h, the mean relative density of the resulting disks was 1.48.

Tests 3, 4, and 5 show not only the superiority of the method of the invention compared with prior art methods, but also that the location and the way in which the leakage passages are made have practically no influence.

Figure 19:
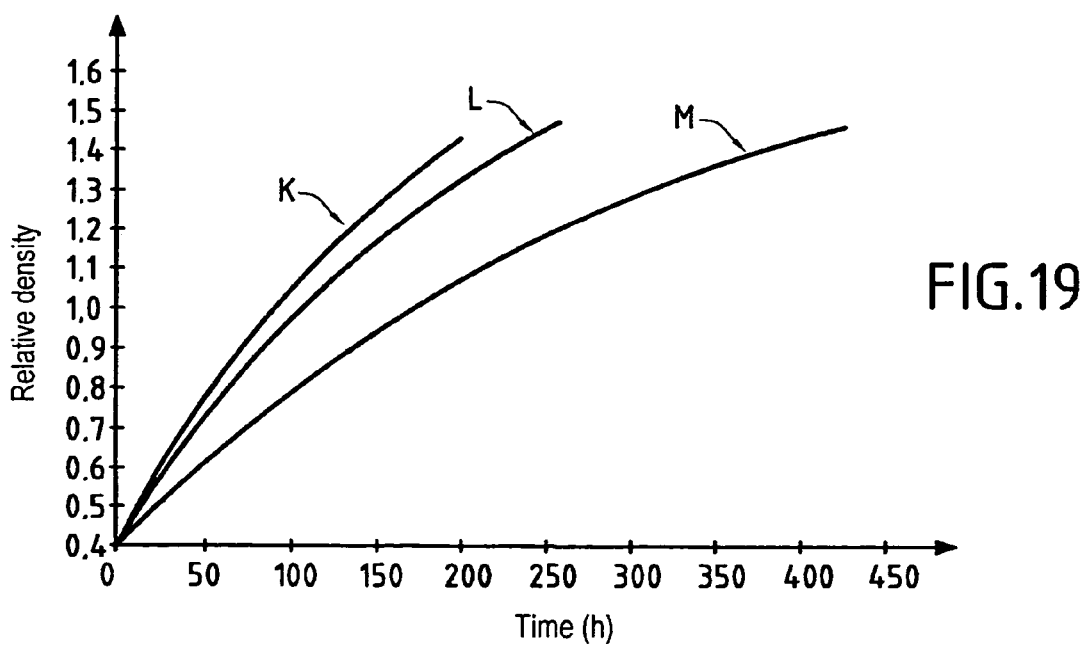
FIG. 19 is a graph plotting curves showing how quickly substrate densification proceeds with prior art forced-gas flow and directed-gas flow densification methods and with a densification method of the invention.

The way in which the density of the substrates varied as a function of time during processes of the kind carried out in Tests 1, 2, and 3 was evaluated. Curves K, L, and M in FIG. 19 show the rate of densification respectively for densification with forced flow, for densification with directed flow, and for densification performed in accordance with the invention.

Comparing curves K, L, and M also shows the advantage of a method in accordance with the invention. A large increase in densification rate compared with the directed flow densification method is obtained. The mean relative density of the load reached 1.50 after 260 h using the method of the invention, whereas after the same duration, it was only 1.90 with the directed flow densification method. About 430 h were required with that method in order to reach a relative density of 1.50. This result was obtained with the method in accordance with the invention without encountering any soot or undesirable change in microstructure.

Compared with the method of forced-flow densification, it can be seen the rate of densification is slightly slower with the method of the invention. However, it is possible to reach a higher density with the method of the invention since the maximum pressure threshold $P_{max}$ is not exceeded, contrary to that which occurs with the forced-flow densification method. With that method, the maximum relative density reached was 1.44.

In conclusion, for equal: gas pressure outside the stack, flow rates, and temperature, the method of the invention makes it possible to perform densification much more quickly than the directed flow densification method and much more completely, although a little more slowly, than the forced-flow densification method. The method of the invention also makes it possible to eliminate any risk of a change in microstructure or of soot formation as are inherent with using the forced-flow densification method.

Although the above-described example relates to a particular type of substrate and a particular type of reactive gas for obtaining a particular desired matrix material, it will immediately be apparent to the person skilled in the art that the method of determining the value $S_{min}$ and $S_{max}$ is easily transposed to any type of substrate presenting a central passage, and to any type of densification process using chemical vapor infiltration.

FIG. 20 shows an application of a method in accordance with the invention to densifying a porous substrate constituting a preform for the diverging portion of a rocket engine nozzle.

The substrate 120 is placed inside an enclosure 110 defined by a susceptor 114 heated by coupling with an induction coil (not shown). As mentioned above, the substrate 120 can be heated in a variant by direct inductive coupling with an induction coil. In another variant, heating of the wall 114 could be of the resistive type.

The enclosure 110 is fed with reactive gas through its bottom 110a. The admitted gas passes through a preheater zone 118 formed by perforated plates situated one above another.

On leaving the preheater zone 118, the gas is channeled into the inside volume 124 constituted by the central passage of the substrate 120. At its top end, the volume 124 is closed off by a cover 125 resting on the substrate 120 and surmounted by a weight 125a serving to hold it in place.

The substrate 120 is supported by a plate 111 presenting a central passage and surmounting the preheater zone 118. Annular spacers 140 leave gaps 122 between the support plate 111 and one end of the substrate 120, and also between the other end of the preform and the cover 125. The spacers 140 are arranged to form leakage passages between the inside volume 124 and the volume 126 outside the substrate 120 and inside the enclosure 110.

The gas admitted into the enclosure flows from the volume 124 to the volume 126, passing through the pores of the substrate 120 and through the leakage passages provided in the gaps 122.

The residual gas is extracted from the volume 126 via a passage in the cover 110b of the enclosure which is in communication with suction means (not shown).

The leakage passages may be arranged in various different ways, for example by making annular spacers 140 in the form of a plurality of non-touching annular sectors, or by making annular spacers as single pieces with radial holes 141 (the example shown), or with notches, in the same manner as described above with reference to FIGS. 8, 9, and 10.

The total leakage section provided by the leakage passages is determined on the same principles as described above, so as to establishes a pressure gradient between the volumes 124 and 126 from the beginning of the densification process, but without exceeding a maximum acceptable pressure value in the volume 124 at the end of the densification process.

In a variant, the gas phase can be channeled to the outer volume 126 and can flow from the outside towards the inside of the preform, with the residual gas being extracted from the inside volume 124. The outer volume 126 is then closed off at its end opposite from the end where the gas is admitted.

In another variant, the gas may flow downwards in the enclosure.

FIG. 21 shows another implementation of a method of the invention for densifying porous substrates constituting preforms for the diverging portions of rocket engine nozzles. Elements that correspond to those of the implementation shown in FIG. 20 are given the same references for the sake of simplicity.

A plurality of substrates 120 are disposed in the same embodiment with their axial passages in vertical alignment. The substrate at the bottom end stands on the plate 111, while the other substrates stand on annular intermediate plates 112. The substrates are engaged partially one in another, and the plates 112 surround the stack of substrates while leaving openings 113 so as to ensure that the volume 126 outside the substrates and inside the enclosure 110 is continuous.

The gas from the preheater zone 118 is channeled to the outer volume 126 through openings 113 in the plate 111. The volume 126 is closed by a cover 127 at its end opposite from that where the gas is admitted. The cover 127 rests on the substrate at the top of the stack. It is provided with a central opening 128 which communicates with the inside of the stack of substrates 120. The cover 127 extends as far as the wall 114 of the enclosure 110 and it is fixed to said wall in leaktight manner.

The gas circulates from the outer volume 126 toward the inside volume 124 formed by the alignment central passages of the substrates, by passing through the pores of the substrates 120, and outside them through leakage passages. Leakage passages are defined by the spaces 115 between the inside edges of the intermediate plates 112 and the outside faces of the substrates 120 surrounded by said plates.

Additional leakage passages 141 can be provided by means of spacers 140 interposed between the bottom substrate and the support plate 111 and/or between the top substrate and the cover 127, as in the embodiment of FIG. 15.

The residual gas is extracted from the inside volume 124 by suction through the opening 128 in the cover 127 and through the cover 110b of the enclosure.

The total leakage section provided by the leakage passages is determined as described above so as to guarantee firstly that a pressure gradient exists as from the beginning of the densification process, and secondly that the maximum pressure for the gas in the outer volume 126 is not exceeded.

The way the total leakage section is distributed along the height of the stack may be uniform or non-uniform. If it is non-uniform, the amount of leakage section should preferably increase in the general flow direction of the gas inside the enclosure.

With the disposition shown for the substrates 120, and with gas being admitted to the bottom portion of the enclosure, it should be observed that it is preferable to cause the gas to flow from the outside towards the inside of the stack so as to ensure that it covers the faces of the substrates in full.

It is possible to envisage establishing a flow of gas from the inside towards the outside of the stack of substrates providing the gas is admitted into the top of the enclosure.

FIG. 22 shows an application of a method of the invention to densifying a porous substrate that is for use in making the throat of a rocket engine nozzle.

The substrate 220 is in the form of a cylindrical annulus and it is disposed inside an enclosure 210 which is defined by a wall 214 and in which there is received an induction coil 216 surrounding the substrate 220. The substrate 220 is supported by a plate 221 disposed above the bottom 210a of the enclosure 210.

The enclosure 210 is fed with reactive gas through the bottom 210a. The admitted gas is channeled towards the inside volume 224 constituted by the central passage of the substrate 220 by passing through a duct surrounded by a wall 219 connecting the gas inlet into the enclosure to a central passage through the support plate 221.

At its top end, the inside volume 224 is closed by a cover 225 resting on the substrate 220 and carrying a weight 225a serving to hold it in place.

Annular spacers 240 are interposed between the support plate 221 and one end of the substrate 220, and between the other end of the substrate 220 and the cover 225. The spacers 240 are arranged, e.g. by being pierced radially, to form leakage passages 241 between the volume 224 and the volume 226 outside the substrate 220, within the enclosure 210.

The gas admitted into the enclosure flows from the volume 224 to the volume 226 by passing through the pores of the substrate 220 and, in addition to the pores, through the leakage passages 241 in the spacers 240. The residual gas is extracted from the volume 226 through a passage formed in the cover 210b of the enclosure 210.

The substrate 220 is heated by direct inductive coupling from the induction coil 216, which has the effect of generating a temperature gradient within the substrate between the inside material thereof and its exposed outer surfaces. Densification is initially enhanced in the hottest, innermost portion of the preform and subsequently progresses towards the outer portions. The existence of a pressure gradient also encourages access for the gas to the inside of the substrate.

The combination of a pressure gradient and of a temperature gradient is thus particularly favorable to obtaining good densification to the core of a thick annular porous substrate such as a substrate that is for use in making a nozzle throat. This leads to a significant advantage in this particular application since after densification, the machining that is performed to obtain the nozzle throat leaves specifically the central portion of the densified substrate (as shown by dashed lines in FIG. 22).

It should be observed that processes of densifying porous annular substrates with heating by direct coupling between the induction coil and the substrates are known. Reference can be made to documents WO 98/17599 and WO 95/11869, for example.

FIG. 23 shows an application of a method of the invention to simultaneously densifying a plurality of porous annular substrates for making rocket engine nozzle throats. Elements corresponding to those shown in FIG. 22 are given the same references for the sake of simplicity.

A plurality of substrates 220 in the form of a cylindrical annuluses are disposed in a common enclosure 210 with their axial passages in vertical alignment. The substrate disposed at the bottom end stands on the plate 211 while the other substrates stand on intermediate annular plates 212.

The gas admitted into the bottom portion of the enclosure 210 is channeled by the wall 219 towards the inside volume 224 constituted by the aligned central passages of the substrates 220 and of the support plates 211, 212. At its top end, the volume 224 is closed off by a cover 225 which may carry a weight 225a. Annular spacers 240 are interposed between the ends of the substrates 220 and the plates 211, 212 or the cover 225. The spacers 240 are arranged, for example by being pierced radially, so as to form leakage passages 241 between the volume 224 and the volume 226 outside the stack of substrates 220, within the enclosure 210.

The gas flows from the volume 224 towards the volume 226 through the pores of the substrates 220, and outside the pores through the leakage passages 241, prior to being evaporated from the enclosure 210 through a passage formed in the cover 210b thereof.

The substrates are heated by direct inductive coupling with the induction coils 216 which surrounds the stack of substrates 220 in the enclosure, inside the side wall 214. The induction coil 216 may be subdivided into a plurality of sections 216a, 216b, 216c that are situated level with the various substrates 220 in the stack. The induction coil sections may be powered separately.

As in the embodiment of FIG. 22, the substrates are densified by combining temperature gradient mode and pressure gradient mode.

In the implementations of FIGS. 22 and 23, the total leakage section is determined by applying the same principles as described above, so as to establish a pressure gradient between the volumes 224 and 226 at the beginning of the densification process, but without exceeding a maximum acceptable pressure value inside the volume 224 at the end of the densification process.

Figure 10:
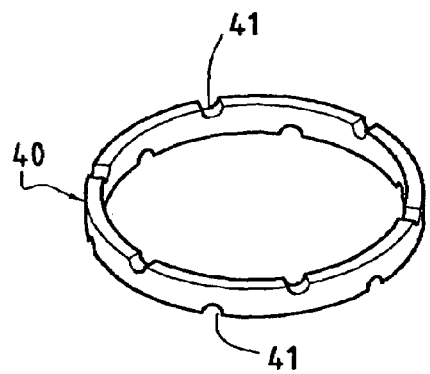

Naturally, different embodiments could be imparted to the annular spacers 240, e.g. as shown in FIGS. 8 and 10. In addition, the leakage passages could be made through the wall 219 and/or through the cover 225 instead of being made through spacers.

It should also be observed that the admitted gas could be channeled towards the outer volume 226, with the gas then flowing from the outside towards the inside of the substrate 220 or the stack of substrates 220. The outer volume is then closed at its end opposite from the end where the gas is admitted.

It is also possible for the gas to flow downwards inside the enclosure.

The invention claimed is:

1. A chemical vapor infiltration method for densifying at least one porous substrate having a central passage, the method comprising the steps of:

placing one or more porous substrates inside an enclosure to define within the enclosure an inside volume formed essentially by the central passage of the substrate or the central passages of a plurality of substrates in alignment, and an outer volume formed essentially by the outside of the substrate(s);

providing at least one leakage passage putting said volumes into communication with each other other than through the substrate(s);

admitting into the enclosure a gas containing at least one gaseous precursor of a matrix material to be deposited within the pores of the substrate(s);

channeling the gas towards a first one of the inside and outer volumes, said first volume being closed at an end opposite from the end where the gas is admitted; and carrying out the densification of said substrate(s) by causing the gas to flow inside the enclosure from the first volume to the other or second of the inside and outer volumes by diffusing through the pores of the substrate(s) and by passing through the or each leakage passage throughout the densification process and by extracting residual gas from the enclosure from the second volume in which:

a maximum acceptable threshold value inside the first volume for the pressure of the gas or for the partial pressure of the precursor contained in the gas is defined; and the total leakage section of the leakage passage(s) is given a value lying between a minimum value such that the maximum pressure value is not exceeded before the end of the densification process, and a maximum value such that a pressure difference is established between the first volume and the second volume as from the beginning of the densification process.

2. A chemical vapor infiltration method for densifying at least one porous substrate having a central passage, the method comprising the steps of:

placing one or more porous substrates inside an enclosure to define within the enclosure an inside volume formed essentially by the central passage of the substrate or the central passages of a plurality of substrates in alignment, and an outer volume formed essentially by the outside of the substrate(s);

providing at least one leakage passage putting said volumes into communication with each other other than through the substrate(s);

admitting into the enclosure a gas containing at least one gaseous precursor of a matrix material to be deposited within the pores of the substrate(s);

channeling the gas towards a first one of the inside and outer volumes, said first volume being closed at an end opposite from the end where the gas is admitted; and carrying out the densification of said substrate(s) by causing the gas to flow inside the enclosure from the first volume to the other or second of the inside and outer volumes by diffusing through the pores of the substrate(s) and by passing through the or each leakage passage, and by extracting residual gas from the enclosure from the second volume, in which:

a maximum acceptable threshold value inside the first volume for the pressure of the gas or for the partial pressure of the precursor contained in the gas is defined; and the total leakage section of the leakage passage(s) is given a value lying between a minimum value such that, for a given gas flow rate admitted into the enclosure, the maximum pressure value is not exceeded before the end of the densification process, and a maximum value such that a pressure difference is established between the first volume and the second volume as from the beginning of the densification process.

3. A chemical vapor infiltration method for densifying at least one porous substrate having a central passage, the method comprising the steps of:

placing one or more porous substrates inside an enclosure to define within the enclosure an inside volume formed essentially by the central passage of the substrate or the central passages of a plurality of substrates in alignment and an outer volume formed essentially by the outside of the substrate(s), providing at least one leakage passage putting said volumes into communication with each other other than through the substrate(s);

admitting into the enclosure a gas containing at least One gaseous precursor of a matrix material to be deposited within the pores of the substrate(s);

channeling the gas towards a first one of the inside and outer volumes, said first volume being closed at an end opposite from the end where the gas is admitted; and carrying out the densification of said substrate(s) by causing the gas to flow inside the enclosure from the first volume to the other or second of the inside and outer volumes by diffusing through the pores of the substrate(s) and by passing through the or each leakage passage, and by extracting residual gas from the enclosure from the second volume, in which;

a maximum acceptable threshold value inside the first volume for the pressure of the gas or for the partial pressure of the precursor contained in the gas is defined; and the total leakage section of the leakage passage(s) is given a value lying between a minimum value such that the maximum pressure value is not exceeded before the end of the densification process, and a maximum value such that a pressure difference is established between the first volume and the second volume as from the beginning of the densification process, the minimum value of the total leakage section being such that the pressure difference between the first and the second volumes at the beginning of the densification process is not greater than 85% of the value of the pressure difference obtained in the absence of any leakage passage.

4. A chemical vapor infiltration method for densifying at least one porous substrate having a central passage, the method comprising the steps of:

placing a plurality of porous substrates inside an enclosure to form at least one stack of substrates with the central passages of the substrates being in alignment, thereby defining within the enclosure an inside volume formed essentially by the inside of the stack(s) and an outer volume formed by the outside of the stack(s), said at least one stack also including spacers each adjacent to one substrate;

providing at least one of said spacers with at least one radial passage forming a leakage passage putting said volumes into communication with each other other than through the substrate(s);

admitting into the enclosure a gas containing at least one gaseous precursor of a matrix material to be deposited within the pores of the substrate(s);

channeling the gas towards a first one of the inside and outer volumes, said first volume being closed at an end opposite from the end where the gas is admitted;

carrying out the densification of said substrate(s) by causing the gas to flow inside the enclosure from the first volume to the other or second of the inside and outer volumes by diffusing through the pores of the substrate(s) and by passing through the or each leakage passage, and by extracting residual gas from the enclosure from the second volume, in which:

a maximum acceptable threshold value inside the first volume for the pressure of the gas or for the partial pressure of the precursor contained in the gas is defined; and the total leakage section of the leakage passage(s) is given a value lying between a minimum value such that the maximum pressure value is not exceeded before the end of the densification process, and a maximum value such that a pressure difference is established between the first volume and the second volume as from the beginning of the densification process.

5. A method according to claim 1, 2, 3, or 4, wherein a value is given to the total leakage section of the leakage passage(s) such that the pressure difference between the first and second volumes at the beginning of the densification process is not less than 15% of the value of the pressure difference obtained in the absence of any leakage passages.

6. A method according to claim 1, 2, or 4, wherein a value is given to the total leakage section of the leakage passage(s) such that the pressure difference between the first and second volumes at the beginning of the densification process is not greater than 85% of the value of the pressure difference obtained in the absence of any leakage passage.

7. A method according to claim 1, 2, or 3, wherein at least one stack of substrates is formed inside the enclosure with the central passages of the substrates being in alignment and with spaces being provided between adjacent substrates by means of spacers, said inside and outer volumes being constituted respectively by the inside and the outside of the stack(s), and at least one of the spacers is arranged to form the leakage passage(s).

8. A method according to claims 1, 2, or 3, wherein at least one stack of substrates is formed inside the enclosure with the central passages of the substrates being in alignment and with spaces being provided between adjacent substrates by means of spacers, said inside and outer volumes being constituted respectively by the inside and the outside of the stack(s), and at least one annular spacer is provided with at least one radial passage forming a leakage passage.

9. A method according to claim 1, 2, or 3, wherein at least one stack of substrates is formed inside the enclosure with the central passages of the substrates being in alignment and with spaces being provided between adjacent substrates by means of spacers, said inside and outer volumes being constituted respectively by the inside and the outside of the stack(s), and at least one spacer is made up of a plurality of portions leaving leakage passages between one another.

10. A method according to claims 1, 2, or 3, wherein at least one stack of substrates is formed inside the enclosure with the central passages of the substrates being in alignment and with spaces being provided between adjacent substrates by means of spacers, said inside and outer volumes being constituted respectively by the inside and the outside of the stack(s), and a plurality of the spacers are arranged to form leakage passages, and the total leakage section of the leakage passages is distributed in non-uniform manner along the height of the or each stack.

11. A method according to claim 1, 2, or 3, wherein at least one stack of substrates is formed inside the enclosure with the central passages of the substrates being in alignment and with spaces being provided between adjacent substrates by means of spacers, said inside and outer volumes being constituted respectively by the inside and the outside of the stack(s), a plurality of the spacers are arranged to form leakage passages, and the leakage section between substrates varies, increasing from the end of the first volume where the gas is admitted to the opposite end.

12. A method according to claim 1, 2, or 3, wherein at least one leakage passage is arranged on the path channeling the gas between the gas inlet into the enclosure and the inlet into said first volume.

13. A method according to claim 1, 2,or 3, wherein at least one leakage passage is arranged in a preheater zone for the gas, on the path channeling the gas between the gas inlet into the enclosure and the inlet into said first volume.

14. A method according to claim 1, 2, or 3, wherein at least one leakage passage is arranged through a wall for closing said first volume at its end opposite from its and where the gas is admitted.

15. A method according to claim 1, 2, 3, or 4, wherein the or each substrate is heated in the enclosure in substantially uniform manner.

16. A method according to claim 1, 2, 3, or 4, wherein the or each substrate is heated in the enclosure with a temperature gradient being set up within the substrate.

17. A method according to claim 1, 2, 3 or 4, wherein the or each substrate is heated in the enclosure with a temperature gradient being set up within the substrate by direct inductive coupling with an induction coil.

18. A method according to claim 1, 2, 3, or 4, wherein fibrous annular substrates are disposed inside the enclosure, said substrates constituting brake disk preforms.

19. A method according to claim 1, 2, or 3, wherein one or more fibrous substrates are disposed inside the enclosure, the substrates constituting one or more preforms for nozzle diverging portions.

20. A method according to claim 1, 2, or 3, wherein one or more fiber substrates are disposed inside the enclosure, the substrates being for making nozzle throats.

21. A method as claimed in claim 4, wherein at least one annular spacer is used, the annular spacer provided with at least one radial passage forming a leakage passage.

22. A method as claimed in claim 4, wherein at least one spacer is used, the spacer made up of a plurality of portions leaving leakage passages between one another.

23. A method as claimed in claim 4, wherein a plurality of spacers are provided with at least one leakage passage, and the total leakage section of the leakage passages is distributed in non-uniform manner along the height of the or each stack.

24. A method as claimed in claim 23, wherein the leakage section between substrates varies, increasing from the end of the first volume where the gas is admitted to the opposite end.

* * * * *

UNITED STATES PATENT AND TRADEMARK OFFICE
CERTIFICATE OF CORRECTION

PATENT NO. : 7,182,980 B2  Page 1 of 1
APPLICATION NO. : 10/468031
DATED : February 27, 2007
INVENTOR(S) : Stéphane Goujard et al.

It is certified that error appears in the above-identified patent and that said Letters Patent is hereby corrected as shown below:

Column 19, claim 14, line 28 "from its and" should read --from its end--.

Signed and Sealed this

Seventh Day of October, 2008

JON W. DUDAS
*Director of the United States Patent and Trademark Office*